United States Patent
Kusunoki

(10) Patent No.: US 7,700,413 B2
(45) Date of Patent: Apr. 20, 2010

(54) PRODUCTION METHOD OF COMPOUND SEMICONDUCTOR LIGHT-EMITTING DEVICE WAFER

(75) Inventor: Katsuki Kusunoki, Ichihara (JP)

(73) Assignee: Showa Denko K.K., Tokyo (JP)

( * ) Notice: Subject to any disclaimer, the term of this patent is extended or adjusted under 35 U.S.C. 154(b) by 14 days.

(21) Appl. No.: 11/578,794

(22) PCT Filed: Apr. 19, 2005

(86) PCT No.: PCT/JP2005/007759

§ 371 (c)(1),
(2), (4) Date: Oct. 18, 2006

(87) PCT Pub. No.: WO2005/104250

PCT Pub. Date: Nov. 3, 2005

(65) Prior Publication Data

US 2007/0173036 A1    Jul. 26, 2007

Related U.S. Application Data

(60) Provisional application No. 60/565,516, filed on Apr. 27, 2004.

(30) Foreign Application Priority Data

Apr. 20, 2004 (JP) ............................. 2004-124165

(51) Int. Cl.
*H01L 21/78* (2006.01)

(52) U.S. Cl. ................ 438/114; 438/115; 438/463; 257/E21.332

(58) Field of Classification Search ............. 438/113, 438/114, 115, 462, 463, 465; 257/E21.328, 257/E21.332, E21.599
See application file for complete search history.

(56) References Cited

U.S. PATENT DOCUMENTS

| 5,994,205 | A  | * | 11/1999 | Yamamoto et al. | .......... 438/464 |
| 6,413,839 | B1 | * | 7/2002  | Brown et al.    | ............. 438/463 |
| 6,688,549 | B1 | * | 2/2004  | Shen            | .......... 242/588 |
| 2003/0045031 | A1 |   | 3/2003  | Kobayashi       |                   |
| 2003/0077847 | A1 | * | 4/2003  | Yoo             | ............. 438/22 |
| 2004/0029362 | A1 | * | 2/2004  | Liu             | ............. 438/460 |
| 2005/0186760 | A1 |   | 8/2005  | Hashimura et al. |                  |

FOREIGN PATENT DOCUMENTS

| CN | 1484328 A    | 3/2004 |
| EP | 1 376 687 A2 | 1/2004 |
| JP | 51-64866 A   | 6/1976 |
| JP | 54-69965 A   | 6/1979 |
| JP | 10-22237 A   | 1/1998 |

(Continued)

*Primary Examiner*—Minh-Loan T Tran
*Assistant Examiner*—W. Wendy Kuo
(74) *Attorney, Agent, or Firm*—Sughrue Mion, PLLC

(57) ABSTRACT

The inventive production method of a compound semiconductor light-emitting device (LED)s wafer comprises a step of forming a protective film on the top and/or bottom surface of a compound semiconductor LEDs wafer, where the devices being regularly and periodically arranged with separation zones being disposed; a step of forming separation grooves by means of laser processing in the separation zones of the surface on which the protective film is formed, while a gas is blown onto a laser-irradiated portion; and a step of removing at least a portion of the protective film, which steps are performed in the above sequence.

8 Claims, 1 Drawing Sheet

FOREIGN PATENT DOCUMENTS

| | | |
|---|---|---|
| JP | 2003-151924 A | 5/2003 |
| JP | 2003-282945 A | 10/2003 |
| JP | 2004-31526 A | 1/2004 |
| JP | 2004-55816 A | 2/2004 |

\* cited by examiner

PRODUCTION METHOD OF COMPOUND SEMICONDUCTOR LIGHT-EMITTING DEVICE WAFER

CROSS REFERENCE TO RELATED APPLICATION

This application is an application filed under 35 U.S.C. §111(a) claiming benefit, pursuant to 35 U.S.C. §119(e)(1), of the filing date of the Provisional Application No. 60/565,516 filed on Apr. 27, 2004, pursuant to 35 U.S.C. §111(b).

TECHNICAL FIELD

The present invention relates to a method for producing a semiconductor wafer which is useful for the production of light-emitting devices such as light-emitting diodes and laser diodes.

BACKGROUND ART

Pn-junction light-emitting diodes (LEDs) are well known as a type of compound semiconductor light-emitting devices. Examples of such known LEDs include a GaP LED having a substrate, and a gallium phosphide (GaP) light-emitting layer obtained through epitaxial growth of an electrically conductive GaP single crystal atop the substrate; an LED which emits red light or orange-yellow to green light, the LED having a light-emitting layer formed of an aluminum gallium arsenide mixed crystal ($Al_xGa_yAs$: $0 \leq X, Y \leq 1$, and $X+Y=1$), or formed of an aluminum gallium indium phosphide mixed crystal ($Al_xGa_yIn_zP$: $0 \leq X, Y, Z \leq 1$, and $X+Y+Z=1$); and a LED which emits short-wavelength light (e.g., near-ultraviolet light, blue light, or green light), the LED having a light-emitting layer formed of a Group III nitride semiconductor such as gallium indium nitride ($Ga_\alpha In_\beta N$: $0 \leq \alpha, \beta \leq 1$, and $\alpha+\beta=1$).

For example, the aforementioned $Al_xGa_yIn_zP$ LED includes a substrate formed of an electrically conductive p-type or n-type gallium arsenide (GaAs) single crystal, on which an electrically conductive n-type or p-type light-emitting layer is formed. The blue LED includes a substrate formed of a single crystal (e.g., an electrically insulating sapphire ($\alpha$-$Al_2O_3$) single crystal). The short-wavelength LED includes a substrate formed of cubic (3C) or hexagonal (4H or 6H) silicon carbide (SiC).

In general, a dicer or a scriber is employed for preparing individual compound semiconductor light-emitting device chips from a compound semiconductor light-emitting device wafer including such a substrate and numerous compound semiconductor light-emitting devices, the devices being regularly and periodically arranged with separation zones being disposed therebetween. A "dicer" is an apparatus for cutting such a wafer into chips through the following procedure: the wafer is subjected to full-cutting by means of rotation of a disk blade having a diamond tip; or grooves having a width larger than that of the blade tip are formed on the wafer (half-cutting), and then the resultant wafer is subjected to cutting by means of external force. Meanwhile, a "scriber" is an apparatus for cutting such a wafer into chips through the following procedure: very thin lines are scribed on the wafer in, for example, a grid form by use of a needle whose tip is formed of diamond, and then the resultant wafer is subjected to cutting by means of external force. A crystal having a zincblende structure, such as GaP or GaAs, exhibits cleavability along a "110" plane. Therefore, by virtue of such a characteristic feature, a semiconductor wafer formed of, for example, GaAs, GaAlAs, or GaP can be relatively easily separated into chips having a desired shape.

However, a nitride semiconductor, which is stacked on a sapphire substrate or a similar substrate, has a heteroepitaxial structure, and has a large lattice constant mismatch with respect to the sapphire substrate. A sapphire substrate has a hexagonal system, and thus exhibits no cleavability. Sapphire and a nitride semiconductor have a Mohs hardness of about 9; i.e., they are very hard substances. Therefore, a wafer including a sapphire substrate and a nitride semiconductor is difficult to cut into chips by use of a scriber. When such a wafer is subjected to full-cutting by use of a dicer, cracking or chipping tends to occur on the cut surfaces; i.e., the wafer cannot be cut into chips successfully. In some cases, a semiconductor layer formed on the sapphire substrate is exfoliated therefrom.

In order to solve such problems, scribing techniques employing laser irradiation have been proposed. As has been reported, when separation grooves are formed on a compound semiconductor wafer by means of laser irradiation, a light-emitting device is produced at high yield and mass-productivity (see, for example, Japanese Patent No. 3449201, Japanese Patent No. 3230572 and Japanese Patent Application Laid-Open (kokai) No. 11-177139). These techniques produce a light-emitting device having a very good shape. However, in practice, debris attributed to laser processing are deposited on the surface of the thus-produced light-emitting device, resulting in lowered efficiency of extraction of light from the device to the outside. When laser processing is performed on semiconductor layers of a compound semiconductor wafer, debris are deposited on the side surfaces of the semiconductor layers or deposited so as to cover surfaces on which a negative electrode and a positive electrode are to be formed, and therefore, electrical characteristics (e.g., the reverse breakdown voltage) of the resultant light-emitting device are deteriorated.

Therefore, a report has been made to the effect that when a protective film is formed on a laser processing surface and contamination deposited onto the protective film is washed away after the formation of a laser groove to solve the problems described above, Group III nitride type compound semiconductor devices can be acquired with high yield (see, for example, Japanese Patent Application Laid-Open (kokai) No. 2004-31526). According to this method, electric characteristics such as reverse breakdown voltage can be improved and the drop of the yield resulting from defect of appearance and characteristics can be improved, it is true, but the problem remains unsolved in that molten matters adhere to the side surface of a separation groove when the separation groove is formed by laser processing and the light emission output of the device drops.

DISCLOSURE OF INVENTION

An object of the present invention is to provide a method for producing a compound semiconductor light-emitting device wafer, which method solves problems in terms of debris which would otherwise be deposited on the surface of the wafer during production thereof. Another object is to provide a compound semiconductor light-emitting device wafer of high quality having no debris.

The present invention provides the following.
(1) A production method of a compound semiconductor light-emitting device wafer comprising a step of forming a protective film on the top surface (i.e., surface on a semiconductor side) and/or the bottom surface of a compound semiconductor light-emitting device wafer including a substrate and numerous compound semiconductor light-emitting devices, the devices being regularly and periodically arranged with separation zones being disposed therebetween; a step of forming separation grooves by means of laser processing in the separation zones of the surface on which the protective film is formed, while a gas is blown onto a laser-irradiated portion; and a step of removing at least a portion of the protective film, which steps are performed in the above sequence.

(2) A production method according to (1) above, wherein the gas blown onto the laser-irradiated portion is sucked by a suction duct.

(3) A production method according to (1) or (2) above, wherein the compound semiconductor is a Group III nitride semiconductor.

(4) A production method according to any one of (1) through (3) above, which further comprises a step of forming trenches in the separation zones of the top surface of the wafer, which step is performed before the protective film formation step.

(5) A production method according to (4) above, wherein the trenches are formed by means of etching.

(6) A production method according to any one of (1) through (5) above, which further comprises a step of thinning the substrate, which step is performed before or after the separation groove formation step.

(7) A production method according to (6) above, which the step of thinning the substrate is performed after the separation groove formation step.

(8) A production method according to any one of (1) through (7) above, wherein the protective film is at least one selected from among a resist, a transparent resin, a glass, a metal, and an insulating film.

(9) A production method according to any one of (1) through (8) above, wherein a laser beam is focused on the surface of the protective film.

(10) A compound semiconductor light-emitting device wafer produced through a production method according to any one of (1) through (9) above.

(11) A wafer according to (10) above, which has a separation groove whose cross section has a V or U shape.

(12) A wafer according to (10) or (11) above, wherein a protective film formed on a trench is not removed.

(13) A wafer according to any one of (10) through (12) above, wherein the protective film is a transparent insulating film.

(14) A wafer according to any one of (10) through (13) above, wherein the bottom surface of the trench is at a level equal to that of a surface on which a negative electrode is formed.

(15) A compound semiconductor light-emitting device produced from a wafer according to any one of (10) through (14) above, wherein at least the top surface of the device and the bottom surface of the device (i.e., the surface of a substrate) have substantially no debris containing at least one component selected from among aluminum, carbon, silicon, chlorine, and oxygen.

(16) A compound semiconductor light-emitting device according to (15) above, wherein the substrate is formed of a material selected from the group consisting of sapphire, SiC, and nitride semiconductor single crystal.

(17) A compound semiconductor light-emitting device according to (16) above, wherein the substrate is formed of sapphire.

According to the present invention, when a protective film is formed on a compound semiconductor light-emitting device wafer before separation grooves are formed on the wafer, and the protective film is removed from the device after formation of the separation grooves, debris which are generated during formation of the separation grooves and are deposited on the wafer are removed together with the protective film. Therefore, the resultant wafer has substantially no debris in the wafer surface including the side of the separation grooves. The wafer does not have debris generated at least during formation of the separation grooves (such debris account for the vast majority of debris generated during production of the compound semiconductor light-emitting device wafer).

The reasons are as follows. When the laser is irradiated to the compound semiconductor light emitting device wafer, the unnecessary molten and evaporated matter can be instantaneously blown away by blowing the gas to the irradiation portion, and does not adhere to the side surface of the separation grooves. Because the suction duct is disposed in the proximity of the irradiation portion and the blown gas is sucked, debris scattering on the wafer surface can be reduced and devices such as an optical lens can be effectively protected from contamination.

Therefore, a compound semiconductor light-emitting device chip produced from the wafer exhibits high light extraction efficiency, and excellent electrical characteristics (e.g., reverse breakdown voltage).

BEST MODE FOR CARRYING OUT THE INVENTION

Figure 1:
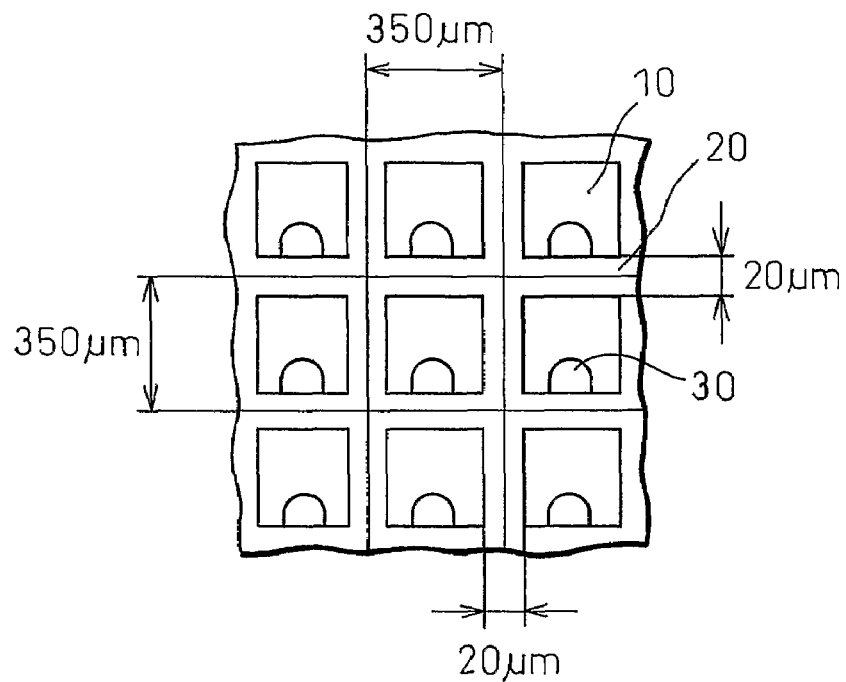
FIG. 1 is a schematic plan view showing a wafer of the present invention produced in Example 1.

No particular limitations are imposed on the material of the substrate of the compound semiconductor light-emitting device wafer of the present invention, and the substrate may be formed of any known material. Examples of the known material include glass; oxide single crystals such as sapphire single crystal ($Al_2O_3$; A-plane, C-plane, M-plane, or R-plane), spinel single crystal ($MgAl_2O_4$), ZnO single crystal, $LiAlO_2$ single crystal, $LiGaO_2$ single crystal, and MgO single crystal; Si single crystal; GaAs single crystal; nitride semiconductor single crystals such as AlN single crystal and GaN single crystal; and boride single crystals such as $ZrB_2$ single crystal. Of these materials, sapphire single crystal, Si single crystal, and nitride semiconductor single crystals are preferred. No particular limitations are imposed on the crystal orientation of the substrate. The substrate may be a just substrate or a substrate having an off-angle.

The substrate to be employed is generally cut out of a single crystal ingot so as to have a thickness of 250 to 1,000 μm. Compound semiconductor layers are stacked on the substrate having a thickness falling within the above range and, subsequently, separation grooves are formed on the semiconductor layers, followed by polishing of the substrate to thin it. Alternatively, the separation grooves may be formed after the substrate is thinned through polishing. The thickness of the substrate after polishing is preferably 150 μm or less, more preferably 100 μm or less. This is because, when the substrate thickness is decreased, the cutting distance can be reduced, whereby the wafer is reliably cut into chips at the positions of the separation grooves.

When the thickness of the semiconductor layers is 5 μm or more, for example, it is advisable to form the separation grooves on the semiconductor layer side and then to reduce the thickness on the substrate side for the following reason.

The greater the thickness of the film thickness of the semiconductor layers, the greater becomes the warp of the wafer due to the difference of coefficients of thermal expansion between the semiconductor layer and the substrate. At this time, the semiconductor layer side describes a convex surface. When the warp of the wafer becomes great, the subsequent formation of the separation grooves and the device becomes extremely difficult. The warp of the wafer can be adjusted by the surface coarseness on the substrate. When the surface coarseness Ra (arithmetic mean coarseness) is great, the wafer becomes flat. The value Ra is preferably at least 0.001 μm and more preferably at least 0.01 μm. When Ra is too great, however, the semiconductor layer side becomes a concave surface, on the contrary. Therefore, Ra is preferably 2 μm or less and more preferably 0.3 μm or less. In the specification of this invention, Ra (arithmetic mean coarseness) of the back surface of the substrate is measured by using an atomic force microscope (product of the GI Company). At this time, the visual field is 30×30 μm, the scan line is 256 and the scan rate is 1 Hz.

Examples of the compound semiconductor layer constituting the light-emitting device include a Group III nitride semiconductor layer such as an $Al_xGa_yIn_zN_{1-a}M_a$ ($0 \leq X \leq 1$, $0 \leq Y \leq 1$, $0 \leq Z \leq 1$, and $X+Y+Z=1$, wherein M represents a Group V element other than nitrogen, and a satisfies the following relation: $0 \leq a \leq 1$) layer, the layer being provided atop, for example, a sapphire substrate, a silicon carbide substrate, or a silicon substrate; an $Al_xGa_yAs$ ($0 \leq X, Y \leq 1$, $X+Y=1$) layer provided atop a gallium arsenide (GaAs) single-crystal substrate; an $Al_xGa_yIn_zP$ ($0 \leq X, Y, Z \leq 1$, $X+Y+Z=1$) layer provided atop a gallium arsenide (GaAs) single-crystal layer; and a GaP layer provided atop a GaP substrate. Particularly in the case of a Group III nitride semiconductor layer, which is difficult to cut, the effects of the present invention become remarkable.

Such a compound semiconductor layer must be provided at an appropriate position atop the substrate for attaining intended performances. For example, in order to form a light-emitting section having a double hetero junction structure, n-type and p-type compound semiconductor layers are provided on the upper and lower surfaces of a light-emitting layer.

No particular limitations are imposed on the method for growing these compound semiconductor layers, and there may be employed any known method for growing a compound semiconductor layer, such as MOCVD (metal organic chemical vapor deposition), HVPE (hydride vapor phase epitaxy), or MBE (molecular beam epitaxy). From the viewpoints of layer thickness controllability and mass productivity, MOCVD is preferably employed.

In the case where Group III nitride semiconductor layers are grown by means of MOCVD, hydrogen ($H_2$) or nitrogen ($N_2$) is employed as a carrier gas, trimethylgallium (TMG) or triethylgallium (TEG) is employed as a Ga (Group III element) source, trimethylaluminum (TMA) or triethylaluminum (TEA) is employed as an Al (Group III element) source, trimethylindium (TMI) or triethylindium (TEI) is employed as an In (Group III element) source, and ammonia ($NH_3$), hydrazine ($N_2H_4$), or the like is employed as an N (Group V element) source. In addition, monosilane ($SiH_4$) or disilane ($Si_2H_6$) serving as an Si source, or an organogermane serving as a Ge source is employed as an n-type dopant, whereas a magnesium compound bis(cyclopentadienyl)magnesium ($Cp_2Mg$) or bis(ethylcyclopentadienyl)magnesium (($EtCp$)$_2$Mg) serving as an Mg source is employed as a p-type dopant.

After lamination of intended semiconductor layers, a positive electrode and a negative electrode are formed on predetermined positions of the semiconductor multilayer structure. No particular limitations are imposed on the positive and negative electrodes employed in the present invention, and there may be employed a variety of positive and negative electrodes for forming a compound semiconductor light-emitting device, which electrodes have known configuration and structure. No particular limitations are imposed on the method for forming the positive and negative electrodes, and any known method, such as vacuum deposition or sputtering, may be employed.

Thus, numerous compound semiconductor light-emitting devices, each having electrodes provided on predetermined positions, are regularly and periodically arranged with separation zones being disposed therebetween. Thereafter, the resultant wafer is coated with a protective film, and then separation grooves are formed in the separation zones. The electrodes may be provided after formation of the separation grooves.

Before formation of the separation grooves, portions of the compound semiconductor multilayer structure that are present in the separation zones may be removed, thereby forming trenches. In the case of a light-emitting device formed by successively stacking an n-type layer, a light-emitting layer, and a p-type layer atop a substrate, preferably, trenches are provided at the same time when portions of the resultant compound semiconductor multilayer structure are removed for formation of a negative electrode on the n-type layer.

Figure 2:
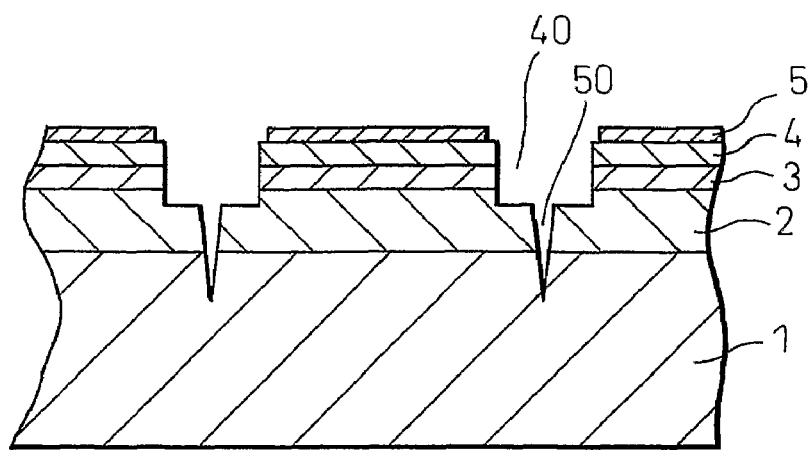
FIG. 2 is a schematic cross-sectional view showing the wafer of the present invention produced in Example 1.

FIG. 1 is a schematic plan view showing a wafer of the present invention produced in Example 1. Reference numeral 10 denotes a light-emitting device, 20 a separation zone, and 30 a negative electrode formation surface. FIG. 2 is a schematic cross-sectional view of the wafer. Reference numeral 1 denotes a substrate, 2 an n-type layer, 3 a light-emitting layer, 4 a p-type layer, and 5 a positive electrode. A portion of the semiconductor multilayer structure present in the separation zone is removed so that the n-type layer is exposed to the outside, thereby forming a trench 40. Reference numeral 50 denotes a separation groove.

The width of each of the trenches is generally equal to that of each of the separation zones, but the trench width may be smaller than the separation zone width. However, the trench width must be greater than the width of each of the separation grooves.

No particular limitations are imposed on the depth of each of the trenches. The trench depth, which varies depending on the thickness of the semiconductor layers, is generally about 1 to about 10 μm. All the semiconductor layers present in the separation zones may be removed so that the substrate surface is exposed to the outside. Preferably, the trenches are formed such that the trench depth is regulated to a level that the n-type layer is exposed to the outside, while the negative electrode formation surface is exposed through etching. This is because the production process can be simplified.

The cross section of each of the trenches may assume any shape, such as a rectangular shape, a U shape, or a V shape. However, the trench cross section preferably assumes a rectangular shape, from the viewpoint of formation of a separation groove on the bottom of the trench.

No particular limitations are imposed on the technique for forming the trenches, and the trenches may be formed by means of any known technique, such as etching, dicing, laser processing, and scribing. However, preferably, the trenches are formed by means of an etching technique such as wet etching or dry etching. This is because, etching tends not to cause damage to the top surface and side surface of the compound semiconductor multilayer structure.

In the case of dry etching, there may be employed a technique such as reactive ion etching, ion milling, focused ion beam etching, or ECR etching, whereas in the case of wet etching, for example, a mixture of sulfuric acid and phosphoric acid may be employed. Needless to say, before etching is performed, a predetermined mask is formed on the top surface of the compound semiconductor multilayer structure so as to attain a desired chip form.

The separation grooves may be formed on the top surface (on the semiconductor side) and/or the bottom surface (on the substrate side) of the wafer. In the case where the separation grooves are formed merely on the bottom surface, the aforementioned trenches must be formed in the separation zones. When the separation grooves are formed merely on the bottom surface without provision of the trenches, the wafer may fail to be successfully cut, along the separation zones, into chips, resulting in an increase in the defective chips.

No particular limitations are imposed on the width of each of the separation grooves, so long as the groove width is smaller than the separation zone width. The depth of each of the separation grooves is preferably 6 μm or more. When the separation groove depth is smaller than 6 μm, the wafer may be cut obliquely into chips, which causes formation of defective chips. The separation groove depth is more preferably 10 μm or more, particularly preferably 20 μm or more.

The cross section of each of the separation grooves may assume any shape, such as a rectangular shape, a U shape, or a V shape, but the groove cross section preferably assumes a V shape. This is because, when the wafer is cut into chips, cracking starts in the vicinity of the bottom end of the V-shaped groove, enabling the wafer to be cut almost perpendicularly.

For forming the separation grooves, laser processing is preferably employed. This is because laser processing can form separation grooves having a predetermined depth, and enables rapid formation of separation grooves, as compared with the case of etching. In addition, as compared with the case of scribing or dicing, laser processing exhibits less variation in processing accuracy, which variation would occur as a result of wear and degradation of a cutting blade or a diamond needle. Furthermore, laser processing enables reduction of production cost, since this technique does not require, for example, the exchanging of the tip of a cutting blade.

The separation grooves formed through laser processing which have, on their side surfaces, irregularities that can be observed under a differential interference optical microscope, enables enhancement of light extraction efficiency. In addition, the depth of each of the intersection points of the lattice-form separation grooves, the points corresponding to the corners of chips, becomes large, and thus the wafer is reliably cut into chips.

No particular limitations are imposed on the type of the laser processing machine to be employed in the present invention, so long as the machine can form separation grooves for separating a semiconductor wafer into chips. Specific examples of the machine which may be employed include a $CO_2$ laser, a YAG laser, an excimer laser, and a pulse laser. Of these, a pulse laser is preferred. The laser frequency may be, for example, 1064 nm, 355 nm or 266 nm.

The laser beam emitted from the laser processing machine can be focused on a predetermined position by means of an optical system (e.g., a lens).

In the case where the separation grooves are formed through laser processing, when a laser beam is radiated to the compound semiconductor wafer such that the beam is focused on the surface of the wafer, heat is conducted to a portion around the laser-irradiated portion, and thus the compound semiconductor multilayer structure is thermally damaged, which causes reduction in yield. Therefore, preferably, the laser beam is focused on the surface of a protective film formed on the compound semiconductor wafer. This is because, during the course of formation of the separation grooves, the protective film absorbs heat which is conducted to a portion around the laser-irradiated portion, and thus heat damage to the compound semiconductor multilayer structure can be reduced.

Also, because the gas is blown to the laser-irradiated portion, the portion around the laser-irradiated portion of the compound semiconductor layer is cooled and thermal damage of the compound semiconductor layer can be reduced. Further, the molten matter generated by irradiating does not adhere to the side surface of the separation grooves but is blown off by the gas stream. Consequently, the light extraction amount from the side surface of the separation grooves can be improved. Furthermore, because the suction duct is disposed in the proximity of the laser-irradiated portion and sucks the blown gas, the debris scattering on the wafer surface can be reduced and devices such as the optical lens can be effectively protected from contamination.

The gases to be blown to the laser-irradiated portion include oxygen, nitrogen, helium, argon, hydrogen, and so forth, and they can be used without any limitation. The helium, hydrogen and nitrogen have particularly a high cooling effect and can be used preferably. Among these gases, nitrogen is more preferable because it is economical. To blow the gas, a nozzle diameter at the distal end is preferably as small as possible. The smaller the nozzle diameter, local blowing becomes possible and the gas flow velocity can be increased.

Formation of separation grooves through laser processing causes particularly considerable scattering of debris, as compared with the case where separation grooves are formed by means of another technique. Therefore, the present invention is particularly effective in the case where separation grooves are formed through laser processing.

Debris which are deposited on the top surface and bottom surface of the semiconductor wafer during formation of the separation grooves are found to contain at least one element selected from among Al, O, C, Cl, Si, and the like as a result of EDX analysis by use of an electron microscope (FE-SEM).

Needless to say, the protective film is provided merely on the surface on which the separation grooves are formed. When the trenches are formed, the protective film is provided after formation of the trenches.

No particular limitations are imposed on the material of the protective film, and the film may be formed of, for example, resist, transparent resin, glass, metal, or insulating film. Examples of the resist include a water-soluble resist employed for photolithography. Examples of the transparent resin include acrylic resin, polyester, polyimide, polyvinyl chloride, and silicone resin. Examples of the metal include nickel and titanium. Examples of the insulating film include silicon oxide film and silicon nitride film. The protective film can be formed by means of a known technique such as application, vapor deposition, or sputtering.

No particular limitations are imposed on the thickness of the protective film, so long as the film has enough strength that prevents the film from being damaged during formation of the separation grooves. The minimum thickness of the protective film is preferably 0.001 μm or more, more preferably 0.01 μm or more. In the case where the thickness of the protective film is excessively large, and when the separation grooves are formed through laser processing, the protective film may absorb a laser beam and may be exfoliated from the wafer. Therefore, the maximum thickness of the protective film is preferably 5 μm or less, more preferably 3 μm or less, particularly preferably 1 μm or less.

After formation of the separation grooves, the protective film and debris deposited on the surface thereof are removed. No particular limitations are imposed on the technique for removing the protective film, so long as the protective film can be removed completely. The protective film may be removed by means of any technique, such as ultrasonic treatment, water jet treatment, showering, immersion, etching, or scrubbing.

A water-soluble resist is preferably employed because a protective film having a uniform thickness can be formed from the resist by use of a spin coater so as to cover the entire surface of the semiconductor wafer, and the resist film can be readily removed through washing with water after formation of the separation grooves.

In the case where the protective film is formed of an insulating film, preferably, the protective film is partially removed such that the film remains on the trenches of the semiconductor wafer, as a short circuit between the positive and negative electrodes is prevented. In this case, preferably, the protective film is formed of a transparent, insulating film. In the case of such partial removal of the protective film, the film may be subjected to selective etching by use of an etching mask.

EXAMPLES

The present invention will next be described in more detail by way of Examples, which should not be construed as limiting the invention thereto.

Example 1

A blue light-emitting device including a gallium nitride compound semiconductor was produced as follows.

An AlN buffer layer was formed on a sapphire substrate. On the AlN buffer layer were successively stacked an underlying layer (thickness: 2 μm) formed of undoped GaN; an n-contact layer (thickness: 2 μm) formed of GaN doped with Si (concentration: $1 \times 10^{19}/cm^3$); an n-cladding layer (thickness: 12.5 nm) formed of $In_{0.1}Ga_{0.9}N$ doped with Si (concentration: $1 \times 10^{18}/cm^3$); a light-emitting layer having a multiple quantum well structure, which was formed by alternately stacking five GaN barrier layers (thickness: 16 nm each) and five $In_{0.2}Ga_{0.8}N$ well layers (thickness: 2.5 nm each), and then providing a GaN barrier layer (thickness: 16 nm) on the uppermost well layer; a p-cladding layer (thickness: 2.5 nm) formed of $Al_{0.07}Ga_{0.93}N$ doped with Mg (concentration: $1 \times 10^{20}/cm^3$); and a p-contact layer (thickness: 0.15 μm) formed of GaN doped with Mg (concentration: $8 \times 10^{19}/cm^3$), to thereby produce a compound semiconductor multilayer structure.

A translucent positive electrode having a multilayer structure including an Au layer and an NiO layer was formed on a predetermined position of the p-contact layer of the above-produced compound semiconductor multilayer structure. Specifically, the positive electrode was formed by successively stacking the Au layer and the NiO layer on the p-contact layer by means of known photolithography and lift-off techniques. Subsequently, by means of a known photolithography technique, there was formed a positive electrode bonding pad having a multilayer structure including a Ti layer, an Al layer, a Ti layer, and an Au layer, the layers being successively provided on the positive electrode in this order.

The above-formed translucent positive electrode was found to have a transmittance of 60% for light of 470 nm. The transmittance was measured by use of a translucent positive electrode formed through the above-described procedure, whose size was regulated to meet transmittance measurement requirements.

Subsequently, separation zones shown in FIG. 1 (pitch: 350 μm, width: 20 μm) were subjected to etching by means of known photolithography and reactive ion etching techniques, so as to attain a depth of 1 μm, thereby forming trenches. Meanwhile, as shown in FIG. 1, a portion of each of the compound semiconductor multilayer structures that faces a separation zone was subjected to etching, to thereby expose the n-contact layer to the outside and form a semicircular negative electrode formation surface (30). Subsequently, a negative electrode having a Ti/Au two-layer structure was formed on the negative electrode formation surface by means of a method known to those skilled in the art.

The bottom surface of the sapphire substrate of the thus-produced compound semiconductor light-emitting device wafer was subjected to lapping and polishing, to thereby reduce the thickness of the substrate to 80 μm. Furthermore, the bottom surface of the sapphire substrate was subjected to mirror polishing to attain an even surface, thereby enabling the aforementioned separation zones to be readily observed through the bottom surface of the substrate.

Thereafter, a water-soluble resist was uniformly applied to the entire surface of the semiconductor multilayer structure of the semiconductor wafer by use of a spin coater, followed by drying, to thereby form a protective film having a thickness of 0.2 μm.

Subsequently, a UV tape was attached to the sapphire substrate of the semiconductor wafer, and then the wafer was fixed on a stage of a pulse laser processing machine by means of a vacuum chuck. The stage is movable in X-axis (right-and-left) and Y-axis (up-and-down) directions, and is rotatable. After fixing the wafer, a laser optical system was controlled such that a laser beam was focused on the surface of the protective film, then the nitrogen gas was blown to the laser-irradiated portion from a nozzle and was sucked by a suction duct, and separation grooves (pitch: 350 μm, depth: 25 μm, width: 10 μm) were formed on the bottom surfaces of the trenches in the X-axis direction of the sapphire substrate. Each of the separation grooves was formed such that its cross section assumed a V shape. Subsequently, the stage was rotated by 90°, and separations grooves were formed in the Y-axis direction in a manner similar to that described above. After formation of the separation grooves, the vacuum chuck was released, and the resultant wafer was removed from the stage.

Subsequently, the semiconductor wafer was placed on a stage of a washing machine, and water was showered to the surface of the semiconductor multilayer structure while the wafer was rotated, to thereby remove the above-formed protective film. Finally, the resultant wafer was rotated at a high speed, to thereby blow off the water to dry of the wafer.

The resultant compound semiconductor light-emitting device wafer was subjected to visual inspection, and no debris were observed on the surface of the wafer. The wafer was cut into numerous light-emitting device chips (each having a size of 350 μm×350 μm) through application of pressure onto the sapphire substrate. The yield of device chips having a good shape was found to be 90%. The yield of device chips having a good shape and exhibiting high reverse breakdown voltage was found to be 86%.

The bare-chip-mounted light-emitting device was subjected to integrating sphere measurement, and the device exhibited an emission output of 5.1 mW at a current of 20 mA.

Comparative Example 1

The procedure of Example 1 was repeated, except that a protective film was not formed, to thereby produce compound semiconductor light-emitting device chips. The surface of each of the thus-produced light-emitting devices was visually observed, and the periphery of the device was found to be considerably contaminated. Therefore, the light-emitting device exhibited low light extraction efficiency; specifically, the device exhibited an emission output of 4.5 mW at a current of 20 mA.

Comparative Example 2

The procedure of Example 1 was repeated, except that blowing and suction of the nitrogen gas to the laser-irradiated portion were not executed, to thereby produce compound semiconductor light-emitting device chips. The side surface of each of the thus-produced light-emitting devices was observed through the microscope, and molten matters were found adhering to the side surface of the separation groove. Therefore, the light-emitting device exhibited low light extraction efficiency; specifically, the device exhibited an emission output of 4.8 mW at a current of 20 mA.

Example 2

The procedure of Example 1 was repeated, except that the shape of trenches was changed as described below, and that the steps of forming and removing a protective film were performed as described below, to thereby produce a compound semiconductor light-emitting device wafer. The width, depth, and pitch of trenches were regulated to 12 µm, 1 µm, and 350 µm, respectively. A silicon oxide insulating film (thickness: 1 µm), serving as a protective film, was formed by means of sputtering. After formation of separation grooves, the protective film was removed through the following procedure: the surface of the compound semiconductor wafer was covered with an etching mask, portions of the etching mask present on regions other than the trenches were removed to thereby form openings, and the resultant wafer was subjected to etching. Therefore, the silicon oxide insulating film remained on the trenches.

The resultant compound semiconductor light-emitting device wafer was subjected to visual inspection. As a result, some debris were observed on the trenches, but no debris were observed on portions of the wafer other than the trenches. The wafer was cut into numerous light-emitting device chips (each having a size of 350 µm×350 µm) through application of pressure onto the sapphire substrate. Similar to the case of Example 1, the yield of device chips having a good shape was found to be 90%. The yield of device chips having a good shape and exhibiting high reverse breakdown voltage was found to be 81%. The resultant light-emitting device exhibited an emission output of 5.0 mW at a current of 20 mA.

Example 3

A blue light-emitting device including a gallium nitride compound semiconductor was produced as follows.

An AlN buffer layer was formed on a sapphire substrate. On the AlN buffer layer were successively stacked an underlying layer (thickness: 8 µm) formed of undoped GaN; an n-contact layer (thickness: 2 µm) formed of GaN doped with Si (concentration: $1\times10^{19}/cm^3$); an n-cladding layer (thickness: 12.5 nm) formed of $In_{0.1}Ga_{0.9}N$ doped with Si (concentration: $1\times10^{18}/cm^3$); a light-emitting layer having a multiple quantum well structure, which was formed by alternately stacking five GaN barrier layers (thickness: 16 nm each) and five $In_{0.2}Ga_{0.8}N$ well layers (thickness: 2.5 nm each), and then providing a GaN barrier layer (thickness: 16 nm) on the uppermost well layer; a p-cladding layer (thickness: 2.5 nm) formed of $Al_{0.07}Ga_{0.93}N$ doped with Mg (concentration: $1\times10^{20}/cm^3$); and a p-contact layer (thickness: 0.15 µm) formed of GaN doped with Mg (concentration: $8\times10^{19}/cm^3$), to thereby produce a compound semiconductor multilayer structure.

A translucent positive electrode having a multilayer structure including an Au layer and an NiO layer was formed on a predetermined position of the p-contact layer of the above-produced compound semiconductor multilayer structure. Specifically, the positive electrode was formed by successively stacking the Au layer and the NiO layer on the p-contact layer by means of known photolithography and lift-off techniques. Subsequently, by means of a known photolithography technique, there was formed a positive electrode bonding pad having a multilayer structure including a Ti layer, an Al layer, a Ti layer, and an Au layer, the layers being successively provided on the positive electrode in this order.

The above-formed translucent positive electrode was found to have a transmittance of 60% for light of 470 nm. The transmittance was measured by use of a translucent positive electrode formed through the above-described procedure, whose size was regulated to meet transmittance measurement requirements.

Subsequently, the separation zones shown in FIG. 1 (pitch: 350 µm, width: 20 µm) were subjected to etching by means of known photolithography and reactive ion etching techniques, so as to attain a depth of 1 µm, thereby forming trenches. Meanwhile, as shown in FIG. 1, a portion of each of the compound semiconductor multilayer structures that faces a separation zone was subjected to etching, to thereby expose the n-contact layer to the outside and form a semicircular negative electrode formation surface (30). Subsequently, a negative electrode having a Ti/Au two-layer structure was formed on the negative electrode formation surface by means of a method known to those skilled in the art.

The bottom surface of the sapphire substrate of the thus-produced compound semiconductor light-emitting device wafer was subjected to lapping and polishing, to thereby reduce the thickness of the substrate to 85 µm. As a result, the warp of the substrate was relatively large as compared with Example 1.

Thereafter, a water-soluble resist was uniformly applied to the entire surface of the semiconductor multilayer structure of the semiconductor wafer by use of a spin coater, followed by drying, to thereby form a protective film having a thickness of 0.2 µm.

Subsequently, a UV tape was attached to the sapphire substrate of the semiconductor wafer, and then the wafer was fixed on a stage of a pulse laser processing machine by means of a vacuum chuck. The stage is movable in X-axis (right-and-left) and Y-axis (up-and-down) directions, and is rotatable. After the fixing of the wafer, a laser optical system was controlled such that a laser beam was focused on the surface of the protective film, then the nitrogen gas was blown to the laser-irradiated portion from a nozzle and was sucked by a suction duct, and separation grooves (pitch: 350 µm, depth: 20 µm, width: 5 µm) were formed on the bottom surfaces of the trenches in the X-axis direction of the sapphire substrate at the processing speed of 70 mm/sec. Each of the separation grooves was formed such that its cross section assumed a V shape. Subsequently, the stage was rotated by 90°, and separations grooves were formed in the Y-axis direction in a manner similar to that described above. After formation of the separation grooves, the vacuum chuck was released, and the resultant wafer was removed from the stage.

Subsequently, the semiconductor wafer was placed on a stage of a washing machine, and water was showered to the surface of the semiconductor multilayer structure while the wafer was rotated, to thereby remove the above-formed protective film. Finally, the resultant wafer was rotated at a high speed, to thereby blow off the water to dry the wafer.

The resultant compound semiconductor light-emitting device wafer was subjected to visual inspection. As a result, the substrate was greatly warped, and thermal damage portions resulting from the laser somewhat occur in the compound semiconductor layer presumably because the focus of the laser is not stably irradiated to the compound semiconductor layer. When the wafer was cut into numerous light-emitting device chips (each having a size of 350 μm×350 μm) through application of pressure onto the sapphire substrate, cracks occurred in the wafer and the yield was 70%. When the products having inferior reverse breakdown voltage were rejected, the yield became 65%. The resultant light-emitting device exhibited an emission output of 4.9 mW at a current of 20 mA.

Example 4

The procedure of Example 3 was repeated, except that the step of lapping and polishing the bottom surface of the sapphire substrate of the compound semiconductor light emitting device wafer was carried out after laser processing, to thereby produce compound semiconductor light-emitting device chips. As a result, a large number of chips of a 350 μm square can be acquired. The yield of device chips having a good shape was found to be 90%. The yield of device chips having a good shape and exhibiting high reverse breakdown voltage was found to be 89%. The resultant light-emitting device exhibited an emission output of 5.3 mW at a current of 20 mA.

INDUSTRIAL APPLICABILITY

A compound semiconductor light-emitting device wafer produced through the method of the present invention has no debris on its surface. Therefore, a light-emitting device produced from the wafer exhibits high light extraction efficiency, and has very high industrial utility value.

The invention claimed is:

1. A production method of a compound semiconductor light-emitting device wafer comprising a step of forming trenches in separation zones of the top surface (i.e., surface on a semiconductor side) of a compound semiconductor light-emitting device wafer including a substrate and numerous compound semiconductor light-emitting devices, the devices being regularly and periodically arranged with the separation zones being disposed therebetween; a step of polishing the back surface of the substrate so as to have a surface coarseness Ra (arithmetic mean coarseness) of 0.001 μm to 2 μm; a step of forming a protective film on the top surface of the wafer; a step of forming separation grooves having a width less than a width of the trench by means of laser processing in the separation zones of the surface on which the protective film is formed, while a gas is blown onto a laser-irradiated portion; and a step of removing at least a portion of the protective film, which steps are performed in the above sequence.

2. A production method according to claim 1, wherein the gas blown onto the laser-irradiated portion is sucked by a suction duct.

3. A production method according to claim 1, wherein the compound semiconductor is a Group III nitride semiconductor.

4. A production method according to claim 1, wherein the trenches are formed by means of etching.

5. A production method according to claim 1, which further comprises a step of thinning the substrate, which step is performed before or after the separation groove formation step.

6. A production method according to claim 5, which the step of thinning the substrate is performed after the separation groove formation step.

7. A production method according to claim 1, wherein the protective film is at least one selected from among a resist, a transparent resin, a glass, a metal, and an insulating film.

8. A production method according to claim 1, wherein a laser beam is focused on the surface of the protective film.

* * * * *